(12) United States Patent
Fujimoto

(10) Patent No.: US 10,896,960 B2
(45) Date of Patent: Jan. 19, 2021

(54) SILICON CARBIDE MOSFET INVERTER CIRCUIT

(71) Applicant: FUJI ELECTRIC CO., LTD., Kawasaki (JP)

(72) Inventor: Takumi Fujimoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 35 days.

(21) Appl. No.: 16/169,063

(22) Filed: Oct. 24, 2018

(65) Prior Publication Data
US 2019/0198620 A1  Jun. 27, 2019

(30) Foreign Application Priority Data

Dec. 25, 2017 (JP) ................. 2017-248500

(51) Int. Cl.
| | |
|---|---|
| *H01L 29/16* | (2006.01) |
| *H01L 29/66* | (2006.01) |
| *H01L 29/78* | (2006.01) |
| *H01L 29/167* | (2006.01) |
| *H01L 21/02* | (2006.01) |

(52) U.S. Cl.
CPC .... *H01L 29/1608* (2013.01); *H01L 21/02236* (2013.01); *H01L 21/02378* (2013.01); *H01L 21/02529* (2013.01); *H01L 29/167* (2013.01); *H01L 29/6606* (2013.01); *H01L 29/66068* (2013.01); *H01L 29/66136* (2013.01); *H01L 29/66143* (2013.01); *H01L 29/78* (2013.01); *H01L 29/7802* (2013.01)

(58) Field of Classification Search
CPC .................................................. H01L 29/7803
See application file for complete search history.

(56) References Cited

U.S. PATENT DOCUMENTS

| | | | | |
|---|---|---|---|---|
| 2009/0168471 | A1* | 7/2009 | Tsugawa | H01L 29/8611 363/56.01 |
| 2011/0248286 | A1* | 10/2011 | Onose | H01L 29/7803 257/77 |
| 2012/0057386 | A1* | 3/2012 | Adachi | H01L 29/66068 363/131 |
| 2016/0336224 | A1* | 11/2016 | Sugahara | H01L 29/7802 |

FOREIGN PATENT DOCUMENTS

JP   2011-082454 A   4/2011

* cited by examiner

*Primary Examiner* — Moazzam Hossain
*Assistant Examiner* — Omar F Mojaddedi

(57) ABSTRACT

An inverter circuit is connected serially with a first silicon carbide MOSFET and a second silicon carbide MOSFET. During a dead time when the first silicon carbide MOSFET and the second silicon carbide MOSFET are OFF, transient current of at least 100 A/cm2 flows in a built-in diode of the first silicon carbide MOSFET and a built-in diode of the second silicon carbide MOSFET.

14 Claims, 9 Drawing Sheets

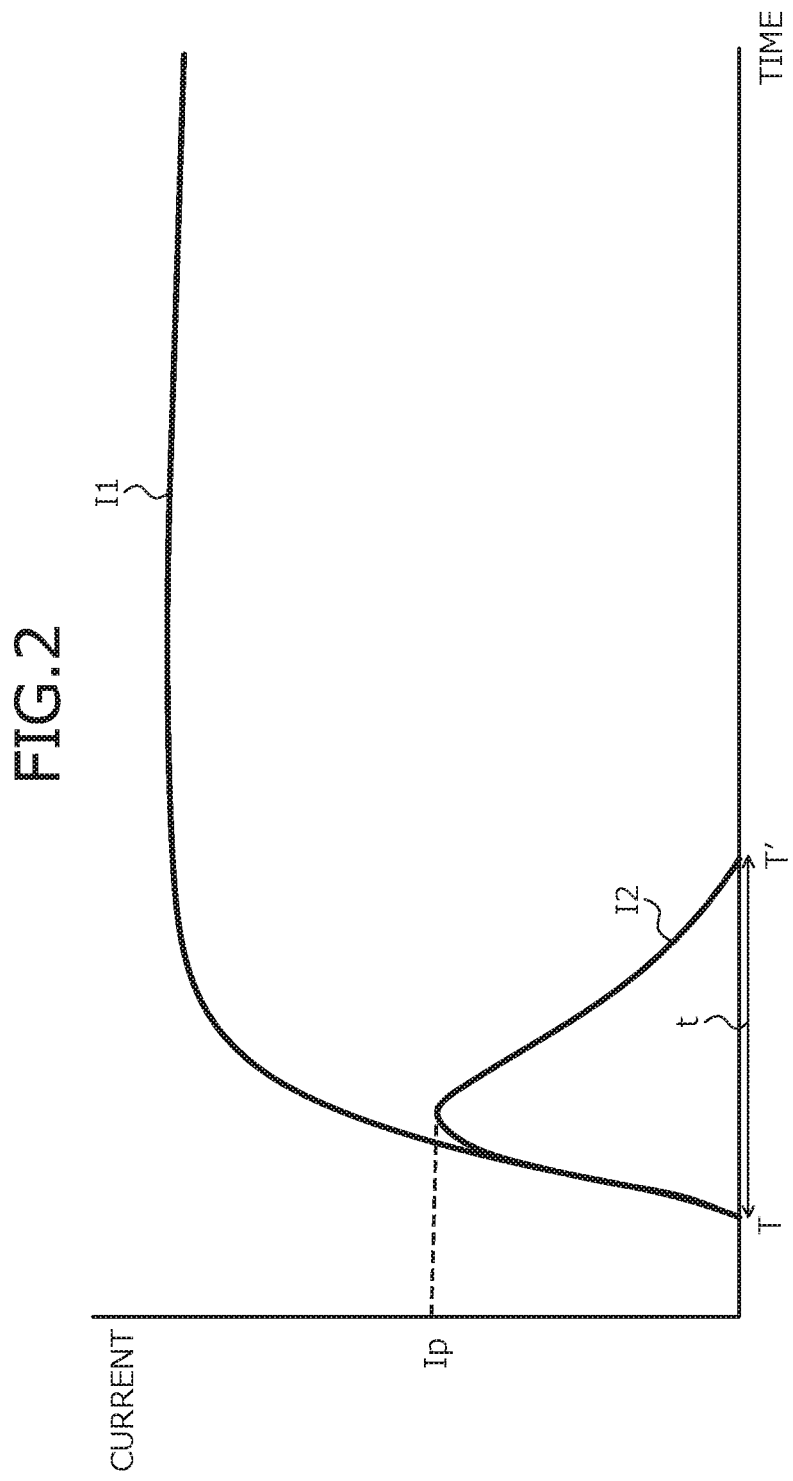

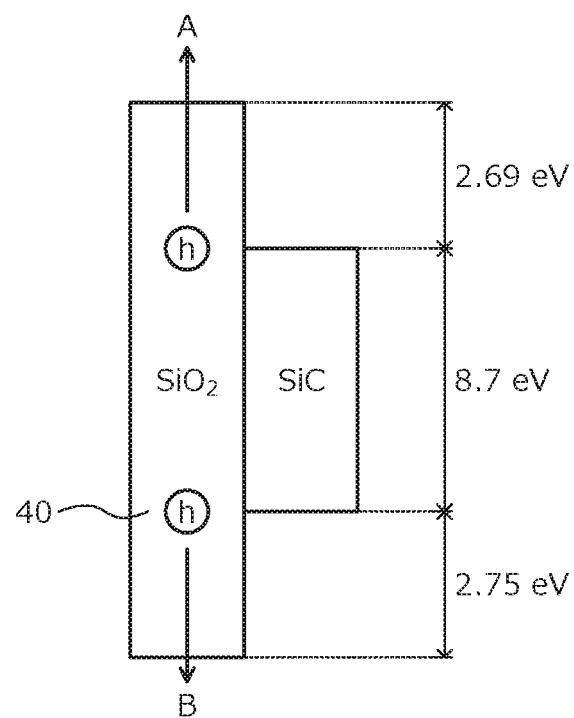

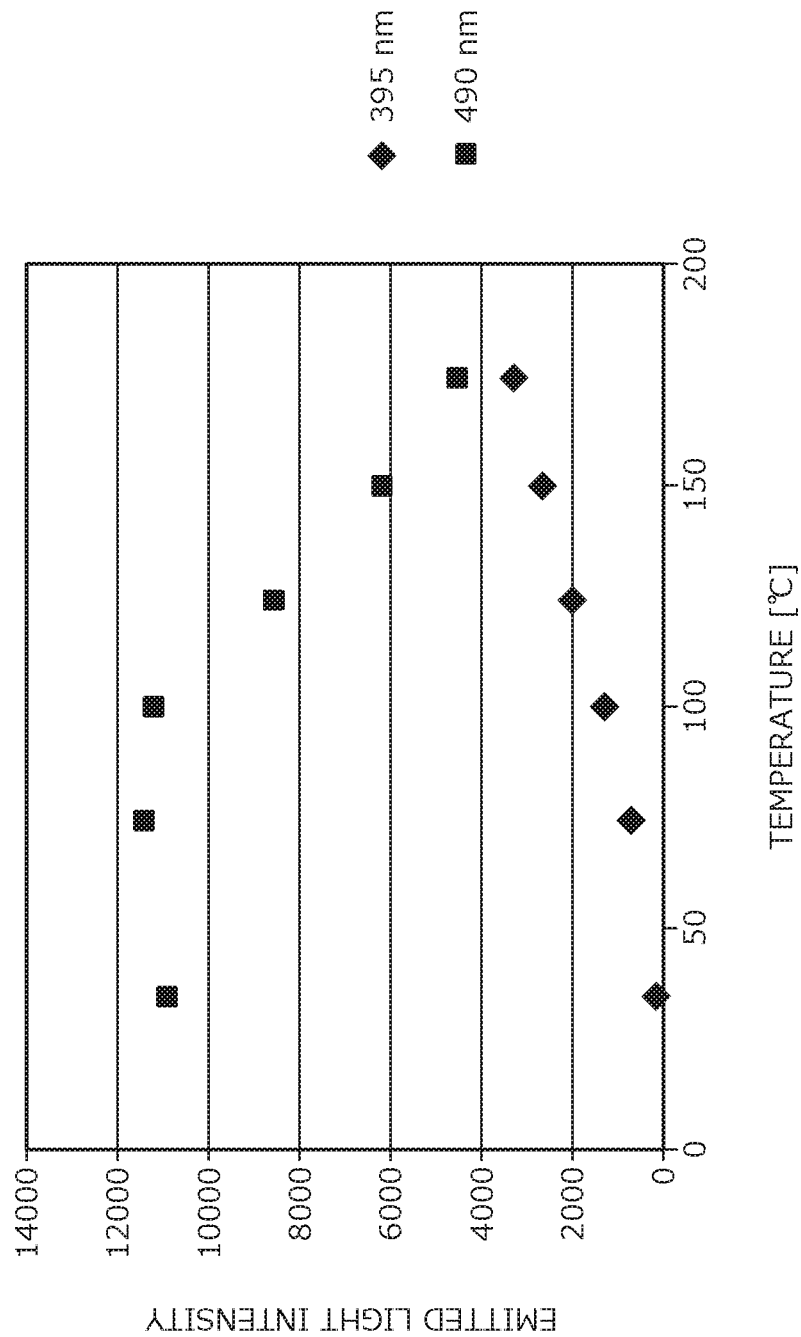

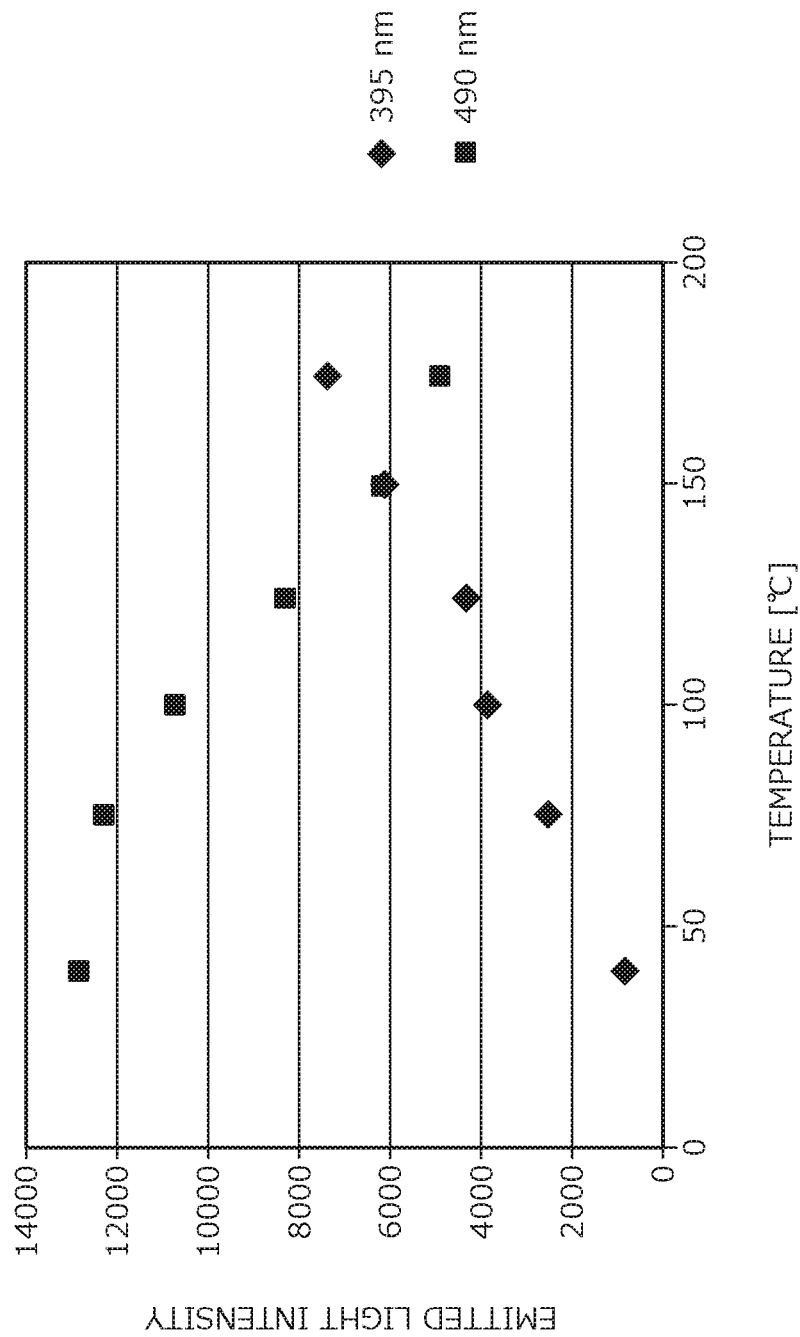

SILICON CARBIDE MOSFET INVERTER CIRCUIT

CROSS REFERENCE TO RELATED APPLICATIONS

This application is based upon and claims the benefit of priority of the prior Japanese Patent Application No. 2017-248500, filed on Dec. 25, 2017, the entire contents of which are incorporated herein by reference.

BACKGROUND

1. Field

Embodiments of the invention relate to silicon carbide MOSFET inverter circuit.

2. Description of Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable material, has a wide bandgap of 3 eV, and can be used very stably as a semiconductor material even at high temperatures. Further, silicon carbide has a critical electric field strength that is ten times that of silicon or greater, and has a high possibility of exceeding the material limit of silicon. Therefore, future growth is strongly expected for power semiconductor applications, particularly MOSFETs.

A structure of a conventional silicon carbide semiconductor device will be described taking a vertical MOSFET as an example. FIG. 8 is a cross-sectional view of a structure of a conventional silicon carbide semiconductor device. As depicted in FIG. 8, on a front surface of an $n^+$-type silicon carbide substrate 1, an n-type silicon carbide epitaxial layer 2 is deposited and at a surface of the n-type silicon carbide epitaxial layer 2, a $p^+$-type base region 3 and a p-type base layer 4 are selectively provided. Further, an $n^+$-type source region 5, a $p^+$-type contact region 6, and an n-type well region 7 are selectively provided at a surface of the $p^+$-type base region 3.

A gate electrode 9 is provided via a gate insulating film at surfaces of the p-type base layer 4 and the $n^+$-type source region 5, 8. Further, a source electrode 10 is provided at surfaces of the n-type silicon carbide epitaxial layer 2, the $p^+$-type contact region 6 and the $n^+$-type source region 5. Further, a drain electrode 11 is provided at a rear surface of the $n^+$-type silicon carbide substrate 1.

In a vertical MOSFET having such a structure, when a high electric field is applied to the gate electrode 9 during operation under high temperature, the threshold voltage (Vth) varies over time. In contrast, an existing technique proposes a SiC-MOSFET that suppresses variation of the threshold voltage by forming a nitride at an interface of the gate insulating film 8 and a silicon carbide layer (e.g., the p-type base layer 4 and the $n^+$-type source region 5) (for example, refer to Japanese Laid-Open Patent Publication No. 2011-82454)

SUMMARY

According to an embodiment of the present invention, a silicon carbide MOSFET inverter circuit includes a first silicon carbide MOSFET; a second silicon carbide MOSFET; and an inverter circuit to which the first silicon carbide MOSFET and the second silicon carbide MOSFET are connected serially. Transient current flows in a built-in diode of the first silicon carbide MOSFET and in a built-in diode of the second silicon carbide MOSFET during a dead time when the first silicon carbide MOSFET and the second silicon carbide MOSFET are OFF, the transient current causing light to be emitted from the built-in diode of the first silicon carbide MOSFET and the built-in diode of the second silicon carbide MOSFET, the light releasing holes present at an interface of an oxide film and a silicon carbide layer of the first silicon carbide MOSFET and at an interface of an oxide film and a silicon carbide layer of the second silicon carbide MOSFET.

In the embodiment, the transient current is at least 100 $A/cm^2$.

In the embodiment, the transient current of at least 100 $A/cm^2$ causes the built-in diode of the first silicon carbide MOSFET and the built-in diode of the second silicon carbide MOSFET to emit light, and energy of the emitted light is at least 3.2 eV.

In the embodiment, the silicon carbide MOSFET inverter circuit further includes a first diode connected in reverse parallel to the first silicon carbide MOSFET; and a second diode connected in reverse parallel to the second silicon carbide MOSFET.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a graph of temporal changes of current flowing in a built-in diode of the silicon carbide MOSFET inverter circuit of a silicon carbide MOSFET of the embodiment;

FIG. 5A is a diagram depicting band offset of silicon carbide and an oxide film;

FIG. 6 is a graph depicting the light emission amount when a peak current of the built-in diode is 50 A/cm$^2$;

FIG. 7 is a graph depicting the light emission amount when the peak current of the built-in diode is 100 A/cm$^2$;

DESCRIPTION OF EMBODIMENTS

Figure 1:
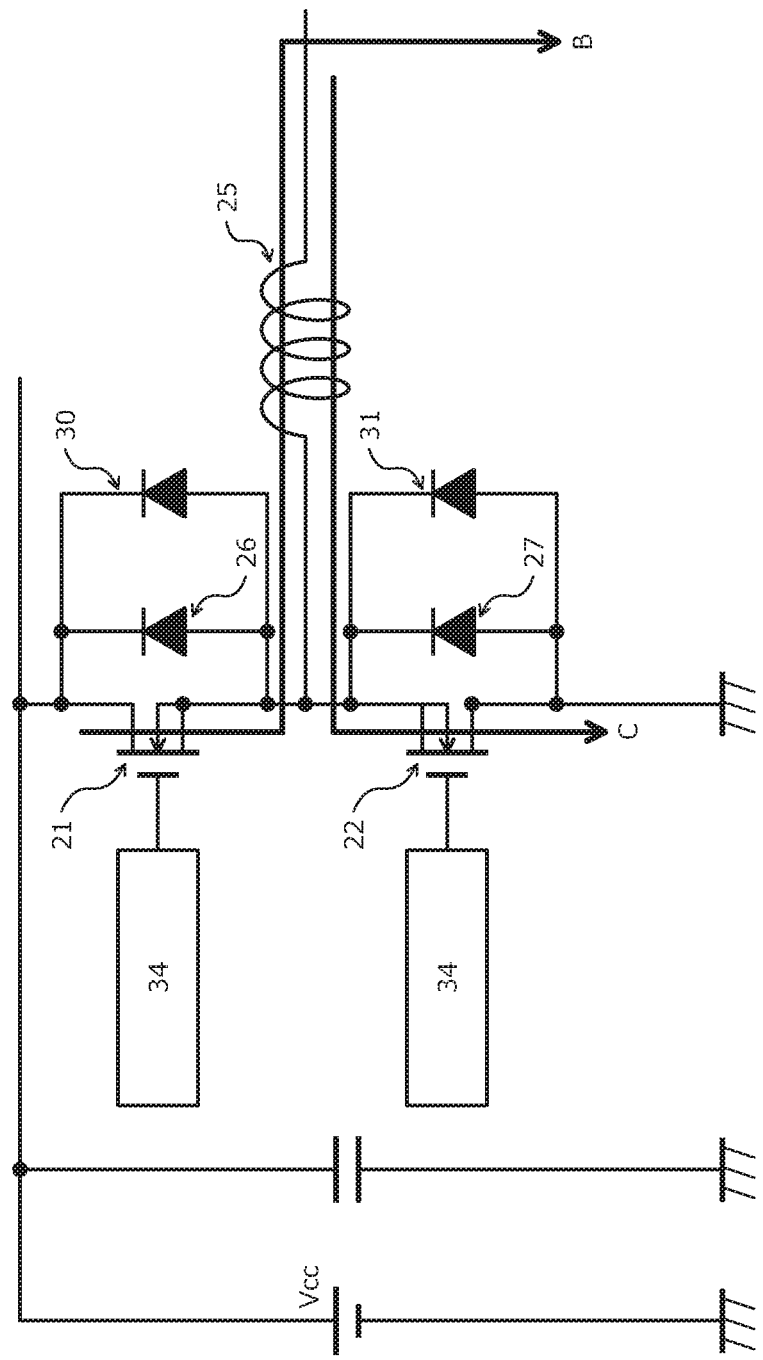
FIG. 1 is a diagram depicting an example of a silicon carbide MOSFET inverter circuit of an embodiment.

First problems associated with the conventional technique will be discussed. When a silicon carbide interface has an interface state of 2×10$^{12}$/cm$^2$, this is a high value compared to an interface state of silica of 1×10$^{10}$/cm$^2$. Therefore, when high electric field is applied to the gate electrode 9, holes, which have positive charge, gradually accumulate at the interface of the gate insulating film 8 and the silicon carbide layer. As a result, high-density hole traps are generated near the interface, and holes (positive charge) become trapped in the hole traps (interface traps). Due to the occurrence of the interface traps, even when a nitride is formed at the interface, a problem arises in that when high electric field is applied to the gate electrode 9, the threshold voltage Vth varies from 0.3V to 0.6V. As a method of forming the gate insulating film 8, NO oxidation, N$_2$O oxidation, wet oxidation, etc. have been proposed. Nonetheless, variation of threshold voltage Vth is difficult to suppress at 0.3V or below.

Embodiments of a silicon carbide MOSFET inverter circuit according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 8:
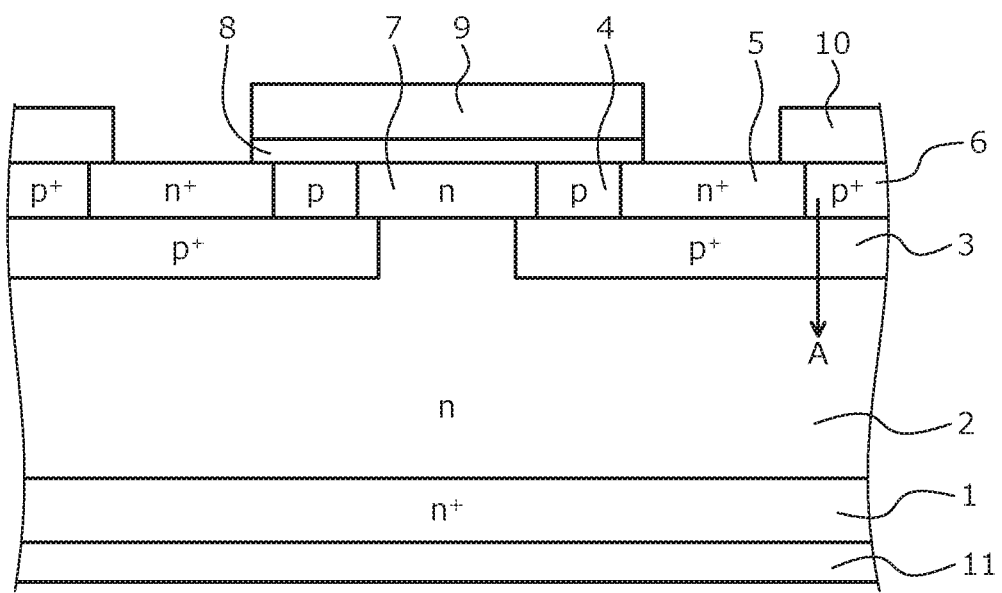
FIG. 8 is a cross-sectional view of a structure of a conventional silicon carbide semiconductor device.

FIG. 1 is a diagram depicting an example of a silicon carbide MOSFET inverter circuit of an embodiment. A silicon carbide MOSFET of the embodiment has a configuration similar to that of the conventional silicon carbide semiconductor device and therefore, depiction and description thereof is omitted hereinafter. While the conventional silicon carbide semiconductor device described with FIG. 8 is a silicon carbide MOSFET having a planar structure in which a channel is formed parallel to a substrate surface, the present invention is applicable to a silicon carbide MOSFET used in an inverter circuit. For example, the present invention is further applicable to a vertical MOSFET having a trench structure in which a channel is formed in an orthogonal direction with respect to the substrate surface.

The vertical MOSFET, as a body diode between a source and a drain, has a built-in parasitic pn diode formed by the p$^+$-type base region 3 and the n-type silicon carbide epitaxial layer 2. The parasitic pn diode may be operated by applying a high potential to the source electrode 10, and current flows in a direction (in FIG. 8, direction indicated by arrow A) from the p$^+$-type contact region 6, through the p$^+$-type base region 3 and the n-type silicon carbide epitaxial layer 2, toward the n$^+$-type silicon carbide substrate 1. In this manner, at the MOSFET, unlike an IGBT, a parasitic pn diode is built-in, whereby a free wheeling diode (FWD) used by the inverter may be omitted, contributing to a lower cost and a smaller size. Hereinafter, the parasitic pn diode of the MOSFET is referred to as "built-in diode".

However, in a silicon carbide semiconductor device, defects may be present in the crystal of the n'-type silicon carbide substrate 1. In this case, when current flows in the built-in diode, holes are injected from the p$^+$-type contact region 6, and recombination of electrons and holes occurs in the n-type silicon carbide epitaxial layer 2 or the n$^+$-type silicon carbide substrate 1. Due to recombination energy (3 eV) of the corresponding band gap occurring at this time, basal plane dislocations, which are one type of crystal defect present in the n$^+$-type silicon carbide substrate 1, migrate and stacking faults sandwiched between two basal plane dislocations expand.

When a stacking fault expands, current does not flow easily through the stacking fault and therefore, ON resistance of the MOSFET and forward voltage of the built-in diode increase. When such operation continues, the stacking fault expands cumulatively and therefore, loss occurring in the inverter circuit increases over time and the amount of heat generated increases, causing device failure. To prevent this problem, as depicted in FIG. 1, a countermeasure of connecting a SiC-Schottky barrier diode (SBD) in reverse parallel to the MOSFET so that current does not flow through the built-in diode MOSFET may be taken.

The inverter circuit depicted in FIG. 1 includes plural MOSFETs (in FIG. 1, two MOSFETs 21, 22), and is a circuit for driving a load 25 of a motor, etc. In FIG. 1, diodes 26, 27 represent the respective built-in diodes of the MOSFETs 21, 22. Further, diodes 30, 31 represent the SiC-SBDs respectively connected in reverse parallel to the MOSFETs 21, 22. In FIG. 1, one phase of the inverter circuit, i.e., only one set of the MOSFETs connected serially is depicted.

In the inverter circuit depicted in FIG. 1, the MOSFET 21 is turned ON by a signal from an input circuit 34, whereby in a direction (direction of arrow B) from the MOSFET 21 toward the load 25, current may flow to the load 25. Thereafter, the MOSFET 21 is turned OFF by a signal from the input circuit 34 and the MOSFET 22 is turned ON, whereby in a direction from the load 25 toward the MOSFET 22 (direction of arrow C), current may flow through the load 25. Such a configuration, changes the direction of the current, whereby, for example, an arm connected to a motor of the load 25 may be moved left and right.

Here, when the MOSFET 21 is OFF, in the MOSFET 21, return current flows in direction opposite that indicated by arrow B. The return current flows in the SiC-SBD 30 whose forward voltage Vf is low and stops flowing in the built-in diode 26. Similarly, in the MOSFET 22, the return current stops flowing in the built-in diode 27. In this manner, when the MOSFET is OFF, the return current does not flow in the built-in diode and therefore, the expansion of stacking faults in the MOSFET does not occur. In the diodes 30, 31, since the stacking faults do not expand, flow of the return current in the diodes 30, 31 is not problematic.

As depicted in FIG. 1, even when the SiC-SBDs 30, 31 are connected in reverse parallel to the MOSFETs 21, 22, at the moment that the MOSFETs 21, 22 switch from ON to OFF, current may flow in the built-in diodes 26, 27 of the MOSFETs 21, 22.

FIG. 2 is a graph of temporal changes of current flowing in the built-in diode of the silicon carbide MOSFET inverter circuit of the silicon carbide MOSFET of the embodiment. In FIG. 2, a horizontal axis indicates time and a vertical axis indicates current. In FIG. 2, I1 represents current flowing in the SiC-SBDs 30, 31 and I2 represents current flowing in the built-in diodes 26, 27.

FIG. 2 depicts temporal current changes when the MOSFETs 21, 22 switch from ON to OFF at a time T. As depicted in FIG. 2, when the MOSFETs 21, 22 turn OFF, the current I1 flowing in the SiC-SBDs 30, 31 gradually increases and settles at a constant value. The current I2 flowing in the built-in diodes 26, 27 gradually increases during a later described dead time from when the MOSFETs 21, 22 turn OFF. Thereafter, the current I2 gradually decreases and settles at 0 at a time T'.

In this manner, the current I2 flowing in the built-in diodes 26, 27 is not usually 0, and flows for a short interval of a transient state when the MOSFETs 21, 22 switch from ON to OFF. For example, transient current having a pulse width t of 0.2 ρs to 1.0 µs flows. Further, the pulse width of the transient current is a period T'-T from the time T when the current value is 0 to the time T' when the current value decreases becoming 0 after having increased to reach a maximum value Ip. The pulse width is the period indicated by reference character t in FIG. 2. Hereinafter, this current is referred to as "transient current".

Figure 3A:
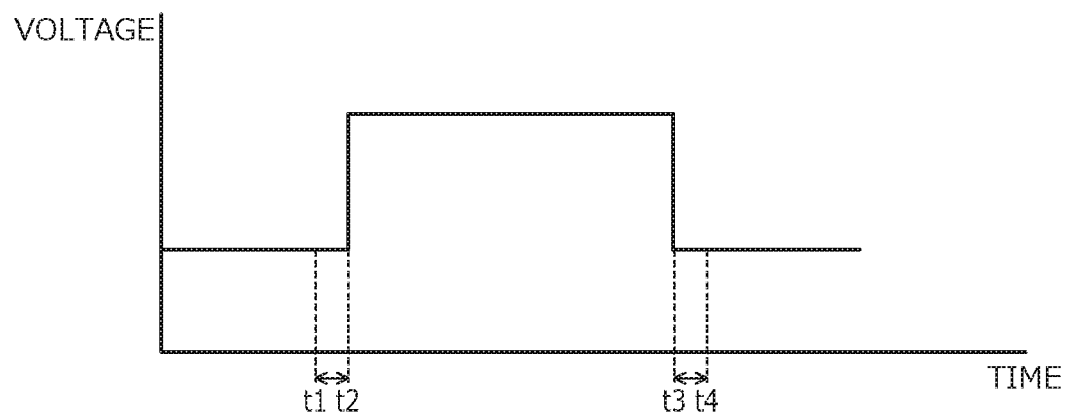
FIG. 3A is a graph of ON/OFF of the silicon carbide MOSFET inverter circuit of the silicon carbide MOSFET of the embodiment.
Figure 3B:
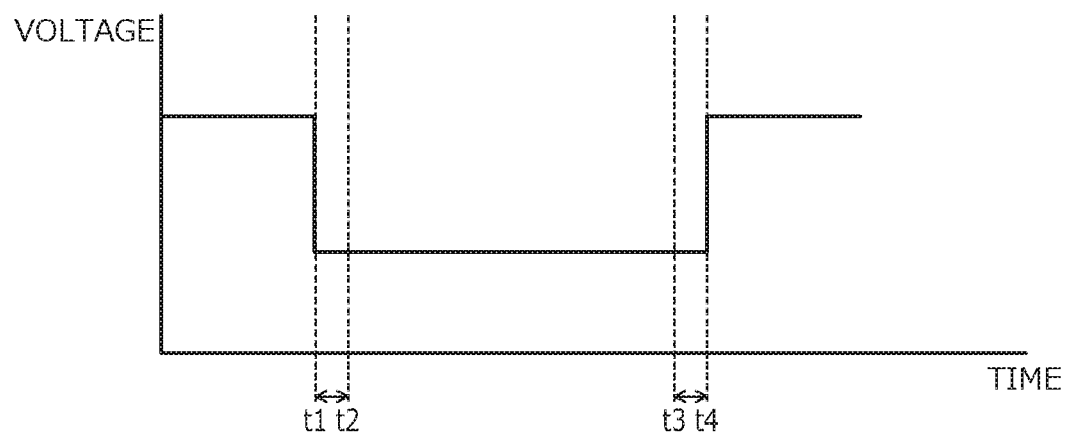
FIG. 3B is a graph of ON/OFF of the silicon carbide MOSFET inverter circuit of the silicon carbide MOSFET of the embodiment.

FIGS. 3A and 3B are graphs of ON/OFF of the silicon carbide MOSFET inverter circuit of the silicon carbide MOSFET of the embodiment. In FIGS. 3A and 3B, a horizontal axis indicates time and a vertical axis indicates voltage. Further, FIG. 3A depicts ON/OFF of the MOSFET 21 of the inverter circuit and FIG. 3B depicts ON/OFF of the MOSFET 22 of the inverter circuit. As depicted in FIGS. 3A and 3B, in the inverter circuit, when the MOSFETs (in FIG. 1, the MOSFET 21 and the MOSFET 22) connected serially turn ON concurrently, a short circuit occurs, damaging the MOSFETs and therefore, the dead time in a case where the MOSFETs turn OFF concurrently is provided. In FIGS. 3A and 3B, an interval t1 to t2, and an interval t3 to t4 are dead times.

Figure 4:
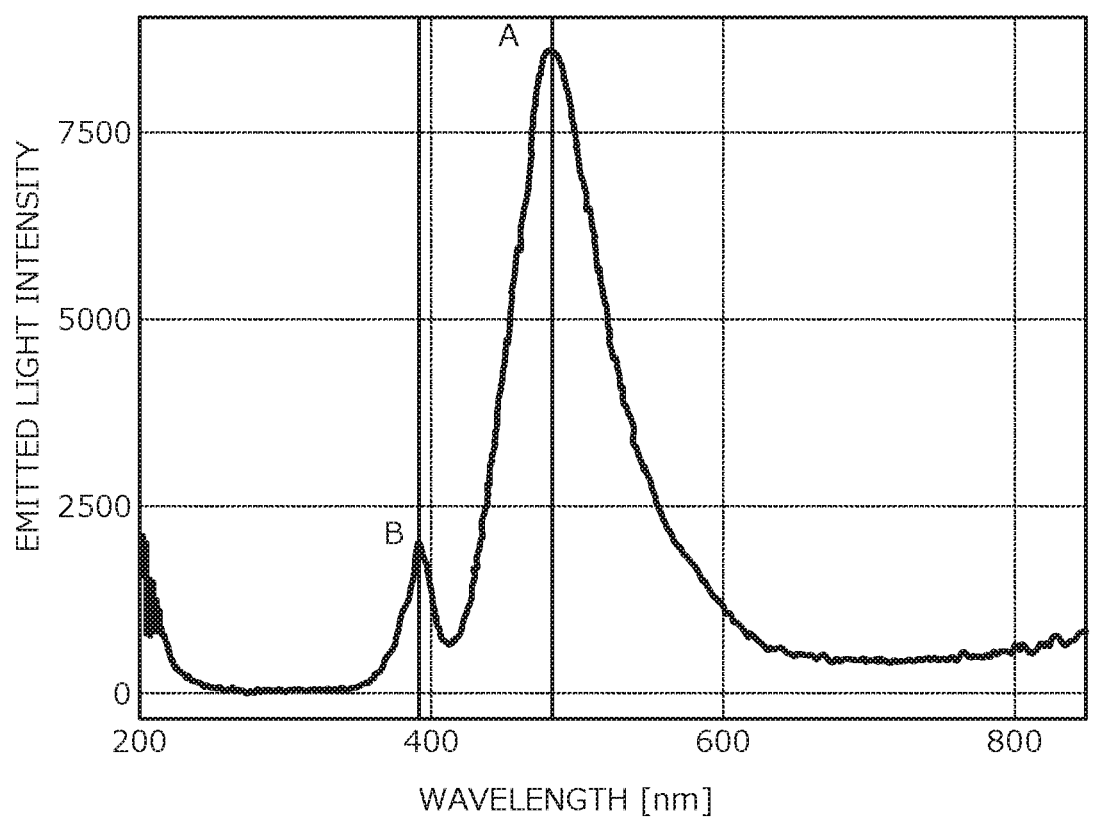
FIG. 4 is a graph depicting light emission amount of the built-in diode of the silicon carbide MOSFET inverter circuit of the silicon carbide MOSFET of the embodiment.

During the dead time, transient current flows in the built-in diodes 26, 27, the built-in diodes 26, 27 emit light. FIG. 4 is a graph depicting the light emission amount of the built-in diode of the silicon carbide MOSFET inverter circuit of the silicon carbide MOSFET of the embodiment. In FIG. 4, a horizontal axis indicates the wavelength of the light emitted from the built-in diode, in units of nm. A vertical axis indicates emitted light intensity of the emitted light. FIG. 4 shows measurement results when the silicon carbide MOSFET is used at room temperature and transient current flows in the built-in diode. As depicted in FIG. 4, from the built-in diode, there are two peaks, a wavelength 490 nm of green light (in FIG. 4, A) and a wavelength 395 nm of ultraviolet light (in FIG. 4, B).

Here, the ultraviolet light of the wavelength 395 nm has energy of 3.2 eV, which is higher than the energy of the green light of the wavelength 490 nm. Therefore, when the ultraviolet light of the wavelength 395 nm is emitted from the built-in diode, holes accumulated at the interface of the gate insulating film 8 and the silicon carbide layer may be driven out.

Figure 5B:
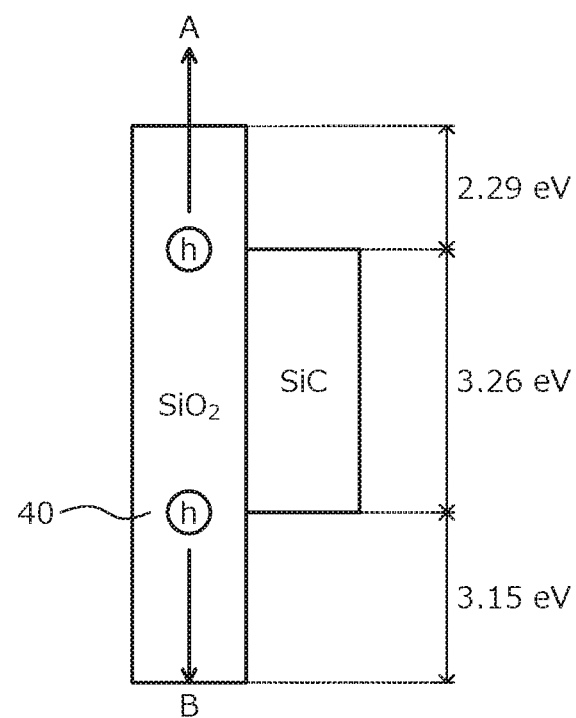
FIG. 5B is a diagram depicting band offset of silicon carbide and an oxide film.

FIGS. 5A and 5B are diagrams depicting band offset of silicon carbide and an oxide film. In FIG. 5A, band offset of silicon carbide of a C (carbon) face and an oxide film ($SiO_2$) is depicted. In FIG. 5B, band offset of the silicon carbide of a Si (silicon) face and the oxide film is depicted. In the figures, a case is depicted in which the silicon carbide is 4H—SiC (4-layer periodic hexagonal silicon carbide). Here, the silicon carbide corresponds to the silicon carbide layer of the silicon carbide semiconductor device and the oxide film corresponds to the gate insulating film 8 of the silicon carbide semiconductor device.

As depicted in FIGS. 5A and 5B, a difference of the band offset of the silicon carbide and of the oxide film is from 2.29 eV to 3.15 eV. Therefore, by irradiating ultraviolet light having energy of 3.2 eV, holes present at the interface of the silicon carbide and the oxide film receive the energy from ultraviolet light, and release the energy from the oxide film in the directions indicated by arrows A, B in FIGS. 5A and 5B. Therefore, the holes that are trapped at the interface of the gate insulating film 8 and the silicon carbide layer decrease, enabling interface traps to be decreased.

On the other hand, the green light of the wavelength 490 nm has low energy and cannot drive out the holes from the oxide film. With the light emission amount of the built-in diode depicted in FIG. 4, the intensity of the ultraviolet light of the wavelength 395 nm is low, and the holes present at the interface of the silicon carbide and the oxide film cannot be driven out from the oxide film. Therefore, with the emitted light of the built-in diode, a strong intensity of the ultraviolet light of the wavelength 395 nm is able to drive out more holes trapped at the interface of the gate insulating film 8 and the silicon carbide layer, further decreasing the interface traps.

FIG. 6 is a graph depicting the light emission amount when a peak current of the built-in diode is 50 A/cm$^2$. Further, FIG. 7 is a graph depicting the light emission amount when the peak current of the built-in diode is 100 A/cm$^2$. Here, the peak current of the built-in diode is a maximum value of the transient current and corresponds to the current Ip in FIG. 2. In FIGS. 6 and 7, a horizontal axis indicates temperature of the silicon carbide MOSFET in units of degrees C. A vertical axis indicates intensity of the emitted light. In FIGS. 6 and 7, a ♦ point indicates the intensity of 395 nm ultraviolet light and a ■ point indicates the intensity of 490 nm green light.

As depicted in FIGS. 6 and 7, with increasing temperature of the silicon carbide MOSFET, the intensity of the ultraviolet light of the wavelength 395 nm increases and the intensity of the green light of the wavelength 490 nm decreases. Further, in comparing FIG. 6 and FIG. 7, it is found that at the same temperature, the higher the peak current of the built-in diode is, the greater is the intensity of the ultraviolet light of the wavelength 395 nm.

Here, as described above, the holes, which have positive charge, gradually accumulate at the interface of the gate insulating film 8 and the silicon carbide layer. Therefore, when the emitted light intensity is low, the amount of holes driven out during the period when the built-in diode emits light decreases and the holes cannot be decreased. Therefore, to decrease the holes, the emitted light intensity has to be at least 4000. Further, the temperature at which the silicon carbide MOSFET is used is about 100 degrees C. and therefore, when the peak current of the built-in diode is 100 A/cm$^2$ or higher, the emitted light intensity is 4000 or higher, enabling the holes to be driven out from the interface of the gate insulating film 8 and the silicon carbide layer.

In the silicon carbide MOSFET inverter circuit of the embodiment, the forward voltage Vf of the SiC-SBDs 30, 31 and the forward voltage Vf of the built-in diodes 26, 27 of the MOSFETs 21, 22 are specified, whereby the peak current of the built-in diode is set to be at least 100 A/cm². For example, increasing the current that flows in the SiC-SBDs 30, 31 enables the current that flows in the built-in diodes 26, 27 to be reduced. As a result, ultraviolet light of the wavelength 395 nm and having a sufficient intensity is emitted during the interval when return current in the built-in diode flows, enabling the holes to be driven out from the interface of the gate insulating film 8 and the silicon carbide layer. Even when the threshold voltage of the silicon carbide MOSFET varies, in the silicon carbide MOSFET inverter circuit of the embodiment, holes at the interface are reduced and interface traps are reduced, enabling the varying threshold voltage to return to the initial state.

Here, experimental results are given for a case where the ultraviolet light of the wavelength 395 nm returned the varied threshold voltage of the silicon carbide MOSFET to the initial state.

(1) First, the threshold voltage at the initial state of the silicon carbide MOSFET was measured. This measurement result was 2.5V.

(2) Next, high positive voltage was applied to the gate electrode 9 of the silicon carbide MOSFET, whereby FN (Fowler Nordheim) tunnel current passing through the gate insulating film 8 flowed for a predetermined period.

(3) Next, after application of the FN tunnel current to the silicon carbide MOSFET, the threshold voltage was measured. This measurement result was 2.3V. The threshold voltage changed 0.2V due to application of the FN tunnel current.

(4) Next, ultraviolet light of a wavelength of 385 nm was irradiated on the gate insulating film 8 of the silicon carbide MOSFET for one hour.

(5) Finally, after irradiation of the ultraviolet light of the wavelength of 385 nm on the silicon carbide MOSFET, the threshold voltage was measured. This measurement result was 2.5V. In this manner, it was confirmed that the threshold voltage was returned to the initial state by the irradiation of the ultraviolet light of the wavelength of 385 nm. Therefore, in the silicon carbide MOSFET inverter circuit of the embodiment, ultraviolet light of the wavelength 395 nm is emitted from the built-in diode, enabling the threshold voltage of the silicon carbide MOSFET to be returned to the initial state.

In the embodiment, while a SiC-SBD is used as a diode connected to the silicon carbide MOSFET, a Si-SBD may be used. For thermal capability of inverter equipment, a SiC-SBD may be used. Further, instead of a SBD, a PN diode may be used. Further, when no diode is connected to the silicon carbide MOSFET, subsequent return current due to transient current flows in the silicon carbide MOSFET and therefore, a diode may be connected. However, when the quality of the silicon carbide semiconductor substrate is high and crystal defects do not grow even when return current flows, without connection of a diode, the built-in diode may be used as a FWD.

As described, according to the inverter circuit of the silicon carbide MOSFET according to the embodiment, 100 A/cm² or greater current flows in the built-in diode and ultraviolet light of the wavelength 395 nm is emitted from the built-in diode. As a result, holes are driven out from the interface of the gate insulating film and the silicon carbide layer, enabling interface traps to be reduced. Therefore, even when the threshold voltage of the silicon carbide MOSFET varies, in the inverter circuit of the silicon carbide MOSFET of the embodiment, the threshold voltage may be returned to the initial state and the threshold voltage of the silicon carbide MOSFET may be stabilized.

In the embodiments of the present invention, various modifications are possible within a range not departing from the spirit of the invention. For example, dimensions, impurity concentrations, etc. of regions may be variously set according to required specifications. Further, in the embodiments, while a case in which silicon carbide is used as a wide bandgap semiconductor material is described as an example, application to a wide bandgap semiconductor material other than silicon carbide such as gallium nitride (GaN) is possible. Further, in the embodiments, while a first conductivity type is assumed to be an n-type and a second conductivity type is assumed to be a p-type, the present invention is similarly implemented when the first conductivity type is a p-type and the second conductivity type is an n-type.

According to the embodiments of the present invention, in the inverter circuit of the silicon carbide MOSFET, 100 A/cm² or greater current flows in the built-in diode and ultraviolet light of the wavelength 395 nm is emitted from the built-in diode, As a result, holes are driven out from the interface of the gate insulating film and the silicon carbide layer, enabling interface traps to be reduced. Therefore, even when the threshold voltage of the silicon carbide MOSFET varies, in the inverter circuit of the silicon carbide MOSFET, the threshold voltage may be returned to the initial state and the threshold voltage of the silicon carbide MOSFET may be stabilized.

The silicon carbide MOSFET inverter circuit according to the embodiments of the present invention achieves an effect in that interface traps at the interface of the gate insulating film and the silicon carbide layer are reduced, enabling the threshold voltage to be stabilized.

As described, the inverter circuit of the silicon carbide MOSFET of the present invention is useful for power converting equipment and power supply devices such as in various industrial machines using an inverter circuit in which a diode is connected in reverse parallel to the silicon carbide MOSFET.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A silicon carbide MOSFET inverter circuit comprising:
a first silicon carbide MOSFET;
a second silicon carbide MOSFET connected serially with the first silicon carbide MOSFET;
a first diode connected in reverse parallel to the first silicon carbide MOSFET;
a second diode connected in reverse parallel to the second silicon carbide MOSFET;
a first parasitic diode included in the first silicon carbide MOSFET; and
a second parasitic diode included in the second silicon carbide MOSFET, wherein
a forward voltage of the first parasitic diode and a forward voltage of the first diode are configured so that a peak current of the first parasitic diode is at least 100 A/cm², and
a forward voltage of the second parasitic diode and a forward voltage of the second diode are configured so that a peak current of the second parasitic diode is at least 100 A/cm².

2. The silicon carbide MOSFET inverter circuit according to claim 1, wherein
the peak current of the built-in diode is a maximum value of a transient current.

3. The silicon carbide MOSFET inverter circuit according to claim 1, wherein
the peak current of at least 100A/cm$^2$ of the first parasitic diode causes the first parasitic diode to emit light,
the peak current of at least 100 A/cm$^2$ of the second parasitic diode causes the second parasitic diode to emit light,
energy of the light emitted by the first parasitic diode is at least 3.2 eV, and energy of the light emitted by the second parasitic diode is at least 3.2 eV.

4. The silicon carbide MOSFET inverter circuit according to claim 3, wherein the light emitted by the first parasitic diode has a wavelength of 395 nm.

5. A silicon carbide MOSFET inverter circuit, comprising:
a first silicon carbide MOSFET; and
a second silicon carbide MOSFET connected serially with the first silicon carbide MOSFET, wherein
the first silicon carbide MOSFET includes a first built-in diode and the second silicon carbide MOSFET includes a second built-in diode, the first built-in diode and the second built-in diode being configured to, during a dead time when the first silicon carbide MOSFET and the second silicon carbide MOSFET are both OFF at a same time, have a transient current flow in the first built-in diode and in the second built-in diode such that the transient current causes light to be emitted from the first built-in diode and the second built-in diode, and the light releases holes present at an interface of an oxide film and a silicon carbide layer of the first silicon carbide MOSFET and at an interface of an oxide film and a silicon carbide layer of the second silicon carbide MOSFET.

6. The silicon carbide MOSFET inverter circuit according to claim 5, wherein the oxide film corresponds to a gate insulating film.

7. The silicon carbide MOSFET inverter circuit according to claim 5, further comprising;
a first Schottky barrier diode connected in reverse parallel to the first silicon carbide MOSFET; and
a second Schottky barrier diode connected in reverse parallel to the second silicon carbide MOSFET.

8. The silicon carbide MOSFET inverter circuit according to claim 5, wherein the transient current occurs for a time interval of 0.2 µs to 1.0 µs.

9. The inverter circuit according to claim 8, wherein the first built-in diode and the second built-in diode are configured such that a peak value of the transient current is at least 100 A/cm$^2$ during the time interval.

10. The silicon carbide MOSFET inverter circuit according to claim 5, wherein the light emitted from the first built-in diode and the second built-in diode has a wavelength of 395 nm.

11. The silicon carbide MOSFET inverter circuit according to claim 5, wherein
the first built-in diode is formed between a source and a drain, by a p+-type base region and a n-type silicon carbide epitaxial layer, of the first silicon carbide MOSFET, and
the second built-in diode is formed between a source and a drain, by a p+-type base region and a n-type silicon carbide epitaxial layer, of the second silicon carbide MOSFET.

12. The silicon carbide MOSFET inverter circuit according to claim 5, wherein
the silicon carbide layer and the oxide film of the first silicon carbide MOSFET have a band offset difference from 2.29 eV to 3.15 eV.

13. The silicon carbide MOSFET inverter circuit according to claim 5, wherein the first built-in diode and the second built-in diode are configured to have a peak current of at least 100 A/cm$^2$.

14. The silicon carbide MOSFET inverter circuit according to claim 13, wherein
the first built-in diode is formed between a source and a drain, by a p+-type base region and a n-type silicon carbide epitaxial layer, of the first silicon carbide MOSFET, and
the second built-in diode is formed between a source and a drain, by a p+-type base region and a n-type silicon carbide epitaxial layer, of the second silicon carbide MOSFET.

\* \* \* \* \*

UNITED STATES PATENT AND TRADEMARK OFFICE
CERTIFICATE OF CORRECTION

PATENT NO. : 10,896,960 B2
APPLICATION NO. : 16/169063
DATED : January 19, 2021
INVENTOR(S) : Takumi Fujimoto It is certified that error appears in the above-identified patent and that said Letters Patent is hereby corrected as shown below:

In the Claims

Column 9, Line 7:
In Claim 3, delete "100A/cm²" and insert -- 100 A/cm² --, therefor.

Column 10, Line 17:
In Claim 11, delete "p+-type" and insert -- $p^+$-type --, therefor.

Column 10, Line 21:
In Claim 11, delete "p+-type" and insert -- $p^+$-type --, therefor.

Column 10, Line 36:
In Claim 14, delete "p+-type" and insert -- $p^+$-type --, therefor.

Column 10, Line 40:
In Claim 14, delete "p+-type" and insert -- $p^+$-type --, therefor.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*